United States Patent
Wu et al.

(10) Patent No.: US 12,176,022 B2
(45) Date of Patent: Dec. 24, 2024

(54) PROGRAMMING AND READING CIRCUIT FOR DYNAMIC RANDOM ACCESS MEMORY

(71) Applicant: Taiwan Semiconductor Manufacturing Company Ltd., Hsinchu (TW)

(72) Inventors: Chen-Jun Wu, Hsinchu (TW); Yun-Feng Kao, Hsinchu (TW); Sheng-Chih Lai, Hsinchu (TW); Katherine H. Chiang, Hsinchu (TW); Chung-Te Lin, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 212 days.

(21) Appl. No.: 17/878,200

(22) Filed: Aug. 1, 2022

(65) Prior Publication Data
US 2024/0038294 A1 Feb. 1, 2024

(51) Int. Cl.
*G11C 11/4096* (2006.01)

(52) U.S. Cl.
CPC .................. *G11C 11/4096* (2013.01)

(58) Field of Classification Search
CPC ............ G11C 11/4096; G11C 11/4091; G11C 11/4094; G11C 11/404
USPC ...................................................... 365/154
See application file for complete search history.

(56) References Cited

U.S. PATENT DOCUMENTS

| | | | |
|---|---|---|---|
| 9,443,844 B2 * | 9/2016 | Takemura | H01L 27/1207 |
| 2009/0185407 A1 * | 7/2009 | Park | H10B 10/00 |
| | | | 365/230.06 |
| 2018/0061497 A1 | 3/2018 | Vu et al. | |
| 2019/0164581 A1 | 5/2019 | Nguyen et al. | |
| 2022/0180943 A1 | 6/2022 | Cernea | |
| 2023/0343385 A1 * | 10/2023 | Yabe | G11C 16/08 |

FOREIGN PATENT DOCUMENTS

| | | | | |
|---|---|---|---|---|
| CN | 113421880 A | * | 9/2021 | G03F 1/70 |
| TW | 200919476 A | | 5/2009 | |
| WO | WO-2015/004708 A1 | | 1/2015 | |

OTHER PUBLICATIONS

Office Action issued in connection with Taiwan Appl. No. 112106063 dated May 21, 2024.

* cited by examiner

*Primary Examiner* — Hoai V Ho
(74) *Attorney, Agent, or Firm* — FOLEY & LARDNER LLP

(57) ABSTRACT

Disclosed herein are related to a memory device. In one aspect, the memory device includes a memory array including a set of memory cells. In one aspect, each of the set of memory cells includes a corresponding transistor and a corresponding capacitor connected in series between a bit line and a select line. In one aspect, the memory device includes a first transistor including a source/drain electrode coupled to a controller and another source/drain electrode coupled to the bit line. In one aspect, the memory device includes a second transistor including a gate electrode coupled to the bit line. In one aspect, the second transistor is configured to conduct current corresponding to data stored by a memory cell of the set of memory cells.

19 Claims, 9 Drawing Sheets

000000000# PROGRAMMING AND READING CIRCUIT FOR DYNAMIC RANDOM ACCESS MEMORY

BACKGROUND

Developments in electronic devices, such as computers, portable devices, smart phones, internet of thing (IoT) devices, etc., have prompted increased demands for memory devices. In general, memory devices may be volatile memory devices or non-volatile memory devices. Volatile memory devices can store data while power is provided but may lose the stored data once the power is shut off. Unlike volatile memory devices, non-volatile memory devices may retain data even after the power is shut off but may be slower than the volatile memory devices.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
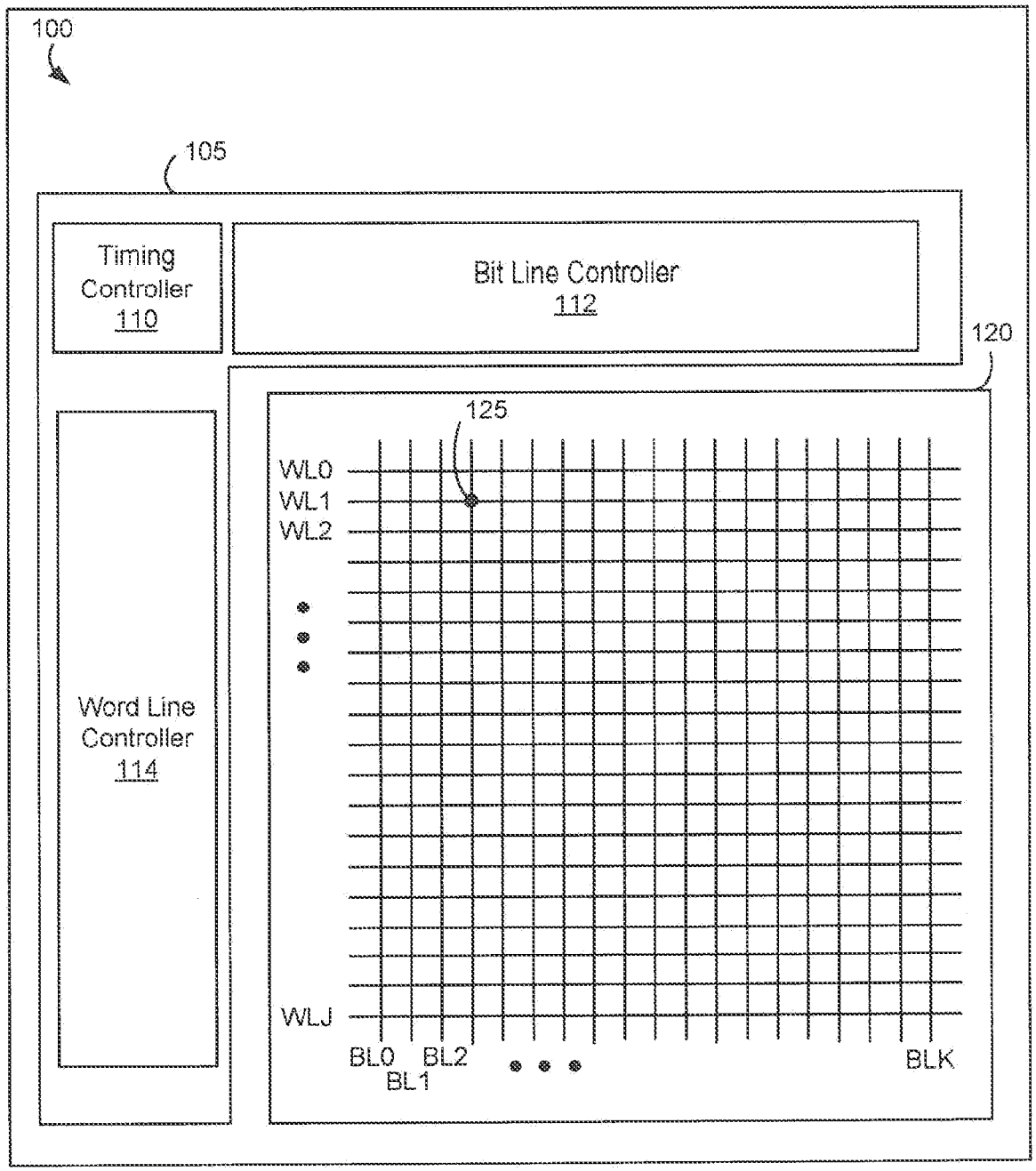
FIG. 1 illustrates a schematic block diagram of an example memory device, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over, or on a second feature in the description that follows may include embodiments in which the first and second features are formed in direct contact and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" "top," "bottom" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Disclosed herein are related to a memory device including a memory array and circuits for programming and reading data stored by the memory array. In one aspect, the memory array includes a set of memory cells. In one aspect, each of the set of memory cells includes a corresponding transistor and a corresponding capacitor connected in series between a bit line and a select line. The set of memory cells may be dynamic random access memory cells. In one aspect, the memory device includes a first transistor including a source/drain electrode coupled to a controller and another source/drain electrode coupled to the bit line. In one aspect, the memory device includes a second transistor including a gate electrode coupled to the bit line. In one aspect, the second transistor is configured to conduct current corresponding to data stored by a memory cell of the set of memory cells.

In one aspect, the first transistor and the second transistor can be controlled or configured to program data by a memory cell of the set of memory cells. For example, to write data to a memory cell, the first transistor and the corresponding transistor of the memory cell can be enabled during a first time period in a programing phase. In addition, during the first time period in the programming phase, a voltage corresponding to the data can be applied to the bit line through the first transistor. For example, a first voltage can be applied to the memory cell to program or store a first logic state (e.g., logic '1') of data. For example, a second voltage lower than the first voltage can be applied to the memory cell to program or store a second logic state (e.g., logic '0') of data.

In one aspect, the first transistor and the second transistor can be controlled or configured to retain or maintain the data stored by the memory cell of the set of memory cells. For example, during a second time period in a retention phase, the first transistor can be enabled, while the corresponding transistor of the memory cell is disabled. In addition, during the second time period in the retention phase, a third voltage between the first voltage and the second voltage can be applied to the bit line through the first transistor. Accordingly, the bit line can be pre-charged to have the third voltage without altering the data stored by the memory cell in the retention phase.

In one aspect, the first transistor and the second transistor can be controlled or configured to read the data stored by the memory cell of the set of memory cells. For example, during a third time period in a reading phase, the first transistor can be disabled, while the corresponding transistor of the memory cell is enabled. In one aspect, during the third time period in the reading phase, a voltage of the bit line can be changed from the third voltage according to the data programmed by the memory cell. For example, if the data stored by the memory cell is the first logic state, then the voltage of the bit line may increase from the third voltage by enabling the corresponding transistor of the memory cell and disabling the first transistor. For example, if the data stored by the memory cell is the second logic state, then the voltage of the bit line may decrease from the third voltage by enabling the corresponding transistor of the memory cell and disabling the first transistor. In one aspect, the second transistor may conduct current according to a change in the voltage of the bit line. Hence, the data programmed by the memory cell can be determined by detecting the current through the second transistor.

Advantageously, the disclosed memory device can be implemented in an area efficient manner. In some cases, a memory device including DRAM memory cells may include complex circuits for programming and reading data. The disclosed memory device implements a first transistor including a source/drain electrode coupled to a bit line of a set of memory cells and a second transistor including a gate electrode coupled to the bit line. By implementing the first transistor and the second transistor having a simple configuration, complex circuits for programming or reading data can be obviated. The first transistor and the second transistor coupled to the bit line can be implemented as a same type of transistors in the DRAM memory cells. Hence, the first transistor and the second transistor coupled to the bit line and the set of memory cells can be implemented in a same layer. By implementing the first transistor and the second transistor in the same layer of the memory cells, the memory device can have a simple configuration and can be implemented in an area efficient manner.

In some embodiments, one or more components can be embodied as one or more transistors. The transistors in this disclosure are shown to have a certain type (N-type or P-type), but embodiments are not limited thereto. The transistors can be any suitable type of transistors including, but not limited to, metal oxide semiconductor field effect transistors (MOSFETs), bipolar junction transistors (BJTs), high voltage transistors, high frequency transistors, FinFETs, planar MOS transistors with raised source/drains, nanosheet FETs, nanowire FETs, or the like. Furthermore, one or more transistors shown or described herein can be embodied as two or more transistors connected in parallel. In one aspect, a transistor includes a source electrode, a drain electrode and a gate electrode. A source electrode and a drain electrode can be interchangeable, according to voltages applied to the source electrode and the drain electrode. Hence, a source electrode or a drain electrode can be referred to as a source/drain electrode herein.

FIG. 1 is a diagram of a memory device 100, in accordance with one embodiment. In some embodiments, the memory device 100 includes a memory controller 105 and a memory array 120. The memory array 120 may include a plurality of storage circuits or memory cells 125 arranged in two- or three-dimensional arrays. Each memory cell 125 may be coupled to a corresponding word line WL and a corresponding bit line BL. The memory controller 105 may write data to or read data from the memory array 120 according to electrical signals through word lines WL and bit lines BL. In other embodiments, the memory device 100 includes more, fewer, or different components than shown in FIG. 1.

The memory array 120 is a hardware component that stores data. In one aspect, the memory array 120 is embodied as a semiconductor memory device. The memory array 120 includes a plurality of storage circuits or memory cells 125. The memory array 120 includes word lines WL0, WL1 . . . WLJ, each extending in a first direction (e.g., X-direction) and bit lines BL0, BL1 . . . BLK, each extending in a second direction (e.g., Y-direction). The word lines WL and the bit lines BL may be conductive metals or conductive rails. In one configuration, each memory cell 125 is coupled to a corresponding word line WL and a corresponding bit line BL, and can be operated according to voltages or currents through the corresponding word line WL and the corresponding bit line BL. In some embodiments, each bit line includes bit lines BL, BLB coupled to one or more memory cells 125 of a group of memory cells 125 disposed along the second direction (e.g., Y-direction). The bit lines BL, BLB may receive and/or provide differential signals. Each memory cell 125 may include a volatile memory, a non-volatile memory, or a combination of them. In some embodiments, each memory cell 125 is embodied as a dynamic random access memory (DRAM) cell or other type of memory cell. In some embodiments, the memory array 120 includes additional lines (e.g., select lines, reference lines, reference control lines, power rails, etc.).

The memory controller 105 is a hardware component that controls operations of the memory array 120. In some embodiments, the memory controller 105 includes a bit line controller 112, a word line controller 114, and a timing controller 110. The bit line controller 112, the word line controller 114, and the timing controller 110 may be embodied as logic circuits, analog circuits, or a combination of them. In one configuration, the word line controller 114 is a circuit that provides a voltage or current through one or more word lines WL of the memory array 120, and the bit line controller 112 is a circuit that provides or senses a voltage or current through one or more bit lines BL of the memory array 120. In one configuration, the timing controller 110 is a circuit that provides control signals or clock signals to synchronize operations of the bit line controller 112 and the word line controller 114. In some embodiments, the timing controller 110 is embodied as or includes a processor and a non-transitory computer readable medium storing instructions when executed by the processor cause the processor to execute one or more functions of the timing controller 110 or the memory controller 105 described herein. The bit line controller 112 may be coupled to bit lines BL of the memory array 120, and the word line controller 114 may be coupled to word lines WL of the memory array 120. In some embodiments, the memory controller 105 includes more, fewer, or different components than shown in FIG. 1.

In one example, the timing controller 110 may generate control signals to coordinate operations of the bit line controller 112 and the word line controller 114. In one approach, to write data to a memory cell 125, the timing controller 110 may cause the word line controller 114 to apply a voltage or current to the memory cell 125 through a word line WL coupled to the memory cell 125 and cause the bit line controller 112 to apply a voltage or current corresponding to data to be stored to the memory cell 125 through a bit line BL coupled to the memory cell 125. In one approach, to read data from a memory cell 125, the timing controller 110 may cause the word line controller 114 to apply a voltage or current to the memory cell 125 through a word line WL coupled to the memory cell 125 and cause the bit line controller 112 to sense a voltage or current corresponding to data stored by the memory cell 125 through a bit line BL coupled to the memory cell 125.

Figure 2:
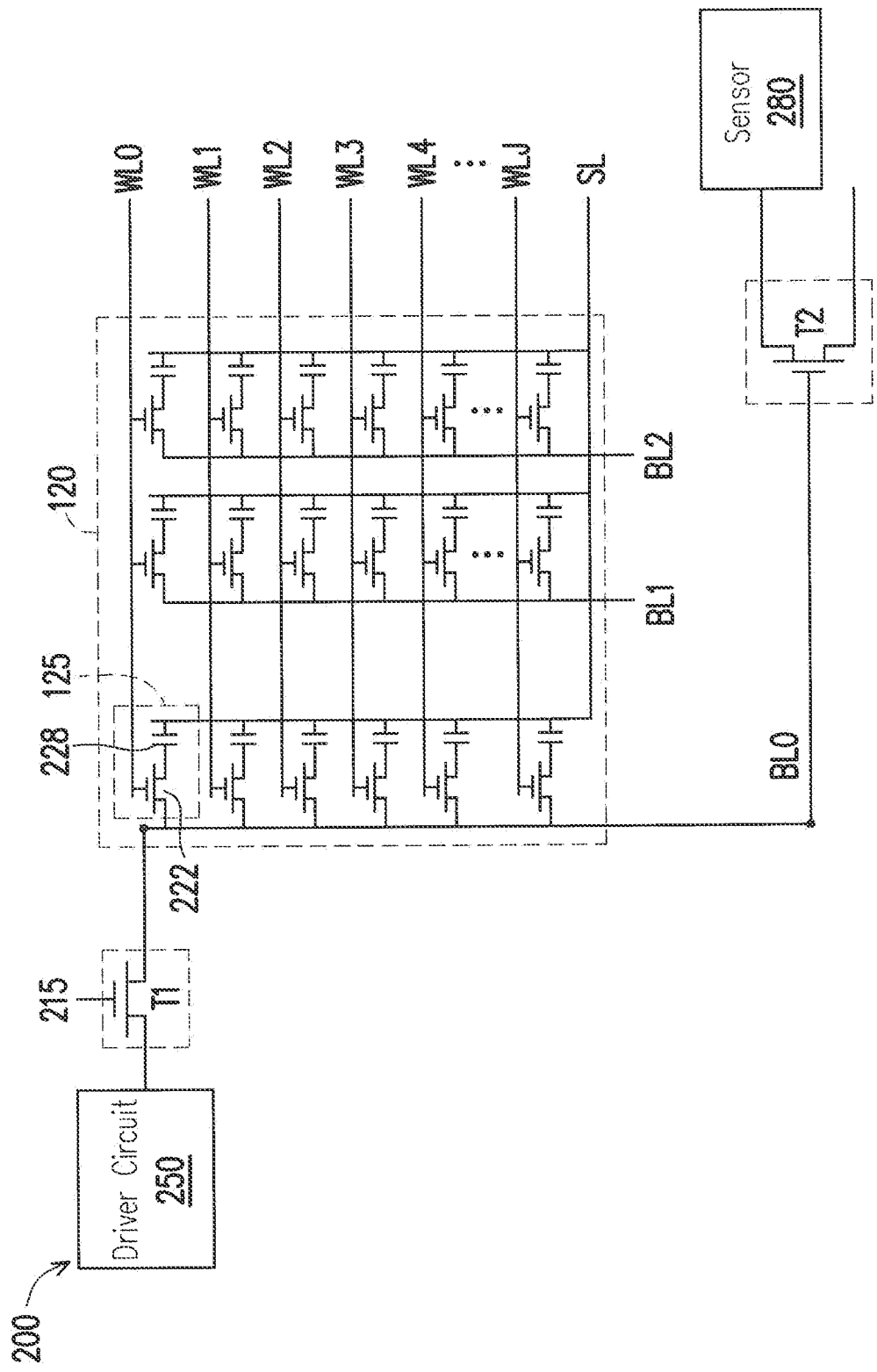
FIG. 2 illustrates a schematic block diagram of an example memory array and circuits for programming and reading data stored by the memory array, in accordance with some embodiments.

FIG. 2 illustrates a schematic block diagram of a portion 200 of the memory device 100 including an example memory array 120 and circuits (e.g., a driver circuit 250, a sensor 280, a bit line select transistor T1, and a bit line sense transistor T2) for programming and reading data stored by the memory array 120, in accordance with some embodiments. In some embodiments, some of the circuits (e.g., the driver circuit 250, the sensor 280, the bit line select transistor T1, and the bit line sense transistor T2) for programming and reading data can be implemented as part of the memory controller 105. For example, the driver circuit 250 and the sensor 280 can be implemented as part of the bit line controller 112 or the memory controller 105. In some embodiments, some of the circuits (e.g., the driver circuit 250, the sensor 280, the bit line select transistor T1, and the bit line sense transistors T2) can be implemented together with the memory array 120. For example, the bit line select transistor T1 and the bit line sense transistor T2 can be implemented together with or as part of the memory array 120.

In some embodiments, the memory array 120 includes a plurality of sets of memory cells 125. In one configuration, the plurality of sets of memory cells 125 may be connected to a common select line SL. In one configuration, each set of memory cells 125 may be connected to a corresponding bit line BL. For example, a first set of memory cells 125 may be connected between a bit line BL0 and a common select line SL, and a second set of memory cells 125 may be connected between a bit line BL1 and the common select line SL. In one configuration, memory cells 125 in different sets of memory cells 125 can be connected to a corresponding word line WL. For example, memory cells 125 in a first row in different sets of memory cells 125 can be coupled to a word line WL0, and memory cells 125 in a second row in different sets of memory cells 125 can be coupled to a word line WL1.

In one configuration, each memory cell 125 may be a DRAM memory cell. Each memory cell 125 may include an enable transistor 222 and a storage component 228. The enable transistor 222 can be a BJT, MOSFET, FinFET, GaaFET, or any transistor. The enable transistor 222 may be an N-type transistor. Examples of the storage component 228 includes a capacitor, a resistor, or any component that can store data. In one configuration, the enable transistor 222 and the storage component 228 are coupled to each other in series between a corresponding bit line BL and the common select line SL. For example, the enable transistor 222 includes a source electrode coupled to the corresponding bit line BL, a gate electrode coupled to a corresponding word line WL, and a drain electrode coupled to a first end of the storage component. A second end of the storage component can be coupled to the common select line SL. In this configuration, the enable transistor 222 can be enabled or disabled, according to a voltage applied to the word line WL. For example, the enable transistor 222 can be enabled, in response to the word line WL having an enable voltage (e.g., VDD or higher). When the enable transistor 222 is enabled, the first end of the storage component 222 can be electrically coupled to the bit line BL. For example, the enable transistor 222 can be disabled, in response to the word line WL having a disable voltage (e.g., 0V or lower). When the enable transistor 222 is disabled, the first end of the storage component 222 can be electrically decoupled from the bit line BL.

The driver circuit 250 is a circuit or a component that can apply a voltage to a bit line BL. In some embodiments, the driver circuit 250 can be replaced by a different component that can perform the functionalities of the driver circuit 250 described herein. In some embodiments, the driver circuit 250 can generate a voltage corresponding to data to store by a memory cell 125. For example, the driver circuit 250 can generate a first voltage (e.g., VDD or 1V) to program a memory cell 125 to store a first logic state. For example, the driver circuit 250 can generate a second voltage (e.g., 0V) lower than the first voltage to program the memory cell 125 to store a second logic state. For example, the driver circuit 250 can generate a third voltage (e.g., ½ VDD or 0.5V) between the first voltage and the second voltage to retain data stored by the memory cell 125. A voltage generated by the driver circuit 250 can be applied to the bit line BL through the bit line select transistor T1 to cause or configure one or more memory cells 125 to store or retain data.

The bit line select transistor T1 is a circuit or a component that can electrically couple a corresponding bit line BL to a driver circuit 250. In one aspect, the memory device 100 includes a plurality of bit line select transistors T1, where each bit line select transistor T1 can be coupled between a corresponding bit line BL and a corresponding driver circuit 250. In FIG. 2, a bit line select transistor T1 coupled to the bit line BL0 is shown, and other bit line select transistors for other bit lines BL are not shown for simplicity. In some embodiments, the bit line select transistor T1 can be replaced by a different component that can perform the functionalities of the bit line select transistor T1 described herein. The bit line select transistor T1 can be a BJT, MOSFET, FinFET, GaaFET, or any transistor. The bit line select transistor T1 may be an N-type transistor. The bit line select transistor T1 and the enable transistors 222 can be of the same type, such that the memory array 120 and the bit line select transistor T1 can be implemented through the same fabrication process in a single layer. In one configuration, the bit line select transistor T1 includes a first source/drain electrode coupled to the driver circuit 250, a second source/drain electrode coupled to the bit line BL, and a gate electrode coupled to a controller (e.g., memory controller 105) to receive a bit line select control signal 215. In this configuration, the bit line select transistor T1 can be enabled or disabled, according to the bit line select control signal 215. For example, the bit line select transistor T1 can be enabled, in response to the bit line select control signal 215 having an enable voltage (e.g., VDD or higher). When the bit line select transistor T1 is enabled, the driver circuit 250 can be electrically coupled to the bit line BL, such that the driver circuit 250 can apply a voltage to the bit line BL. For example, the bit line select transistor T1 can be disabled, in response to the bit line select control signal 215 having a disable voltage (e.g., 0V or lower). When the bit line select transistor T1 is disabled, the driver circuit 250 can be electrically decoupled from the bit line BL, such that a voltage from the driver circuit 250 may not be applied to the bit line BL.

The bit line sense transistor T2 is a circuit or a component that can sense a voltage at the bit line BL. In one aspect, the memory device 100 includes a plurality of bit line sense transistors T2, where each bit line sense transistor T2 can be coupled between a corresponding bit line BL and a sensor 280. In FIG. 2, a bit line sense transistor T2 coupled to the bit line BL0 is shown, and other bit line sense transistors for other bit lines BL are not shown for simplicity. In some embodiments, the bit line sense transistor T2 can be replaced by a different component that can perform the functionalities of the bit line sense transistor T2 described herein. The bit line sense transistor T2 can be a BJT, MOSFET, FinFET, GaaFET, or any transistor. The bit line sense transistor T2 may be an N-type transistor. The bit line select transistor T1, the bit line sense transistor T2, and the enable transistors 222 can be of the same type, such that the memory array 120, the bit line select transistor T1, and the bit line sense transistor T2 can be implemented through the same fabrication process in a single layer. In one configuration, the bit line sense transistor T2 includes a gate electrode coupled to the bit line BL, and a first source/drain electrode coupled to the sensor 280. A second source/drain electrode of the bit line sense transistor T2 can be coupled to a metal rail providing a ground voltage (e.g., 0V). The sensor 280 can be a current sensor or a voltage sensor. In this configuration, the bit line sense transistor T2 can conduct current, according to a voltage of the bit line BL. Hence, by setting or adjusting a voltage of the bit line BL according to data stored by a memory cell 125, the bit line sense transistor T2 can conduct current corresponding to the data stored. Moreover, the sensor 280 can detect the current through bit line sense transistor T2 to determine the data stored by the memory cell 125.

Advantageously, the disclosed memory device 100 can be implemented in an area efficient manner. In some cases, a memory device including DRAM memory cells (e.g., memory cells 125) may include complex circuits for programming and reading data. The disclosed memory device 100 implements, for a bit line BL, a bit line select transistor T1 and a bit line sense transistor T2 having a simple configuration. By implementing the bit line select transistor T1 and the bit line sense transistor T2, complex circuits for programming or reading data can be obviated. In one aspect, the bit line select transistor T1, the bit line sense transistor T2, and enable transistors 222 of the memory cells 125 can be of a same type. Hence, the bit line select transistor T1, the bit line sense transistor T2, and the enable transistors 222 of the memory cells 125 can be implemented in a same layer through the same fabrication process. By implementing the bit line select transistor T1 and the bit line sense transistor T2 in the same layer of the memory cells 125, the memory device 100 can have a simple configuration and can be implemented in an area efficient manner.

Figure 3:
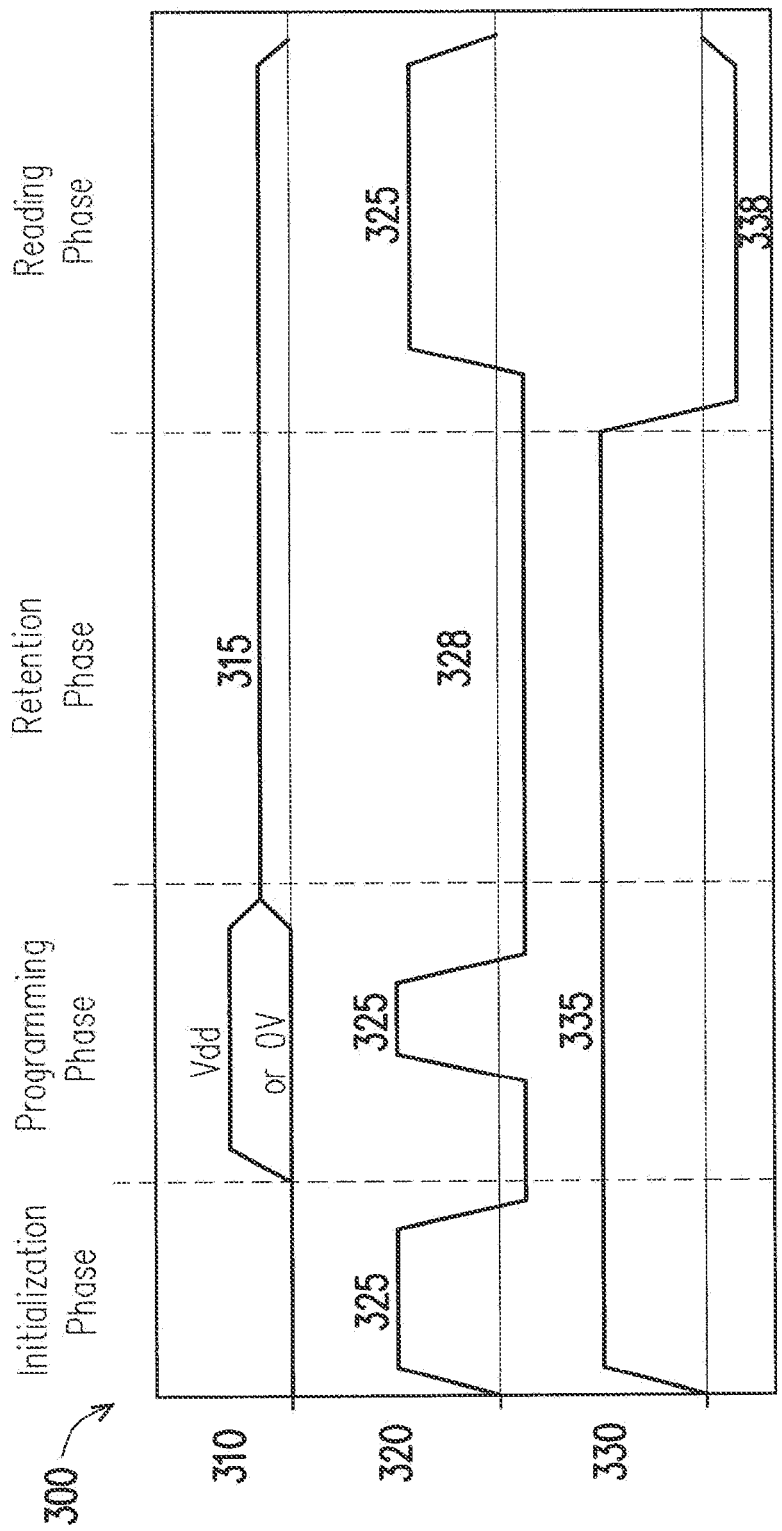
FIG. 3 illustrates a timing diagram of operating a memory device, in accordance with some embodiments.

FIG. 3 illustrates a timing diagram 300 of operating a memory device 100, in accordance with some embodiments. The timing diagram 300 includes voltage waveforms 310, 320, 330. The voltage waveform 310 shows a voltage output from a driver circuit 250. The voltage waveform 320 shows a voltage of a word line WL connected to a selected memory cell 125. The voltage waveform 330 shows a voltage of a bit line select control signal 215 applied to a gate electrode of a bit line select transistor T1 coupled to the selected memory cell 125. In one approach, the memory device 100 operates in four phases: an initialization phase, a writing phase, a retention phase, and a reading phase.

In the initialization phase during a first time period, the driver circuit 250 may generate a ground voltage (or 0V). In the initialization phase, the bit line controller 112 may apply a reference voltage (e.g., ½ VDD or 0.5V) to the select line SL. In the initialization phase, the word line controller 114 may generate an enable voltage 325 (e.g., VDD or higher), and may apply the enable voltage 325 to a word line WL coupled to a gate electrode of an enable transistor 222 in a selected memory cell 125. In response to the enable voltage 325, the enable transistor 222 in the selected memory cell 125 can be enabled to electrically couple a storage component 228 of the selected memory cell 125 to the bit line BL. In the initialization phase, the memory controller 105 or the timing controller 110 may generate an enable voltage 335 (e.g., VDD or higher), and may apply the enable voltage 335 to a gate electrode of a bit line select transistor T1 coupled to the selected memory cell 125. In response to the enable voltage 335, the bit line select transistor T1 coupled to the selected memory cell 125 can be enabled to electrically couple the driver circuit 250 to the bit line BL coupled to the selected memory cell 125. Hence, the ground voltage (or 0V) output from the driver circuit 250 can be applied to the storage component 228 of the selected memory cell 125 through the bit line select transistor T1 and the enable transistor 222 of the selected memory cell 125. By applying the ground voltage (or 0V) to the storage component 228 of the selected memory cell 125, the storage component 228 of the selected memory cell 125 can be initialized or discharged. In some embodiments, initialization can be performed for a set of memory cells 125 simultaneously by applying the enable voltage 325 (e.g., VDD or higher) to word lines WL coupled to gate electrodes of enable transistors 222 in the set of memory cells 125.

In the programming phase during a second time period after the first time period for the initialization phase, the driver circuit 250 may generate a voltage corresponding to a data to store. For example, the driver circuit 250 can generate a first voltage (e.g., VDD or 1V) to program the selected memory cell 125 to store a first logic state. For example, the driver circuit 250 can generate a second voltage (e.g., 0V) lower than the first voltage to program the selected memory cell 125 to store a second logic state. In the programming phase, the bit line controller 112 may apply a reference voltage (e.g., ½ VDD or 0.5V) to the select line SL. In the programming phase, the word line controller 114 may generate the enable voltage 325 (e.g., VDD or higher), and may apply the enable voltage 325 to the word line WL coupled to the gate electrode of the enable transistor 222 in the selected memory cell 125. In response to the enable voltage 325, the enable transistor 222 in the selected memory cell 125 can be enabled to electrically couple the storage component 228 of the selected memory cell 125 to the bit line BL. In the programming phase, the word line controller 114 may generate a disable voltage 328 (e.g., 0V or lower), and may apply the disable voltage 328 to a word line WL coupled to a gate electrode of an enable transistor 222 in an unselected memory cell 125 of the set of memory cells 125. In response to the disable voltage 328, the enable transistor 222 in the unselected memory cell 125 can be disabled to electrically decouple a storage component 228 of the unselected memory cell 125 from the bit line BL to prevent the unselected memory cell 125 from being programmed. In the programming phase, the memory controller 105 or the timing controller 110 may generate the enable voltage 335 (e.g., VDD or higher), and may apply the enable voltage 335 to the gate electrode of the bit line select transistor T1 coupled to the selected memory cell 125. In response to the enable voltage 335, the bit line select transistor T1 coupled to the selected memory cell 125 can be enabled to electrically couple the driver circuit 250 to the bit line BL coupled to the selected memory cell 125. Hence, the voltage output from the driver circuit 250 can be applied to the storage component 228 of the selected memory cell 125 through the bit line select transistor T1 and the enable transistor 222 of the selected memory cell 125. By applying the voltage corresponding to the data to store to the storage component 228, the storage component 228 can store charges corresponding to the applied voltage.

In the retention phase during a third time period after the second time period for the programming phase, the driver circuit 250 may generate a reference voltage (e.g., ½ VDD or between the first voltage (e.g., VDD or 1V) and the second voltage (e.g., 0V). In the retention phase, the bit line controller 112 may apply the reference voltage (e.g., ½ VDD or to the select line SL. In one aspect, retaining data is performed for a set of memory cells 125, such that programming or reading data for an individual memory cell 125 in the set of memory cells 125 may not be performed. In the retention phase, the word line controller 114 may generate a disable voltage 328 (e.g., 0V or lower), and may apply the disable voltage 328 to word lines WL coupled to gate electrodes of the enable transistors 222 in a set of memory cells 125. In response to the disable voltage 328, the enable transistors 222 in the set of memory cells 125 can be disabled to electrically decouple the storage components 228 of the set of memory cells 125 from the bit line BL. In the retention phase, the memory controller 105 or the timing controller 110 may generate the enable voltage 335 (e.g., VDD or higher), and may apply the enable voltage 335 to the gate electrode of the bit line select transistor T1 coupled to the set of memory cells 125. In response to the enable voltage 335, the bit line select transistor T1 coupled to the set of memory cells 125 can be enabled to electrically couple the driver circuit 250 to the bit line BL. Hence, the reference voltage 315 output from the driver circuit 250 can be applied to the bit line BL, but not to the storage components 228 of the set of memory cells 125. Accordingly, the bit line BL can be pre-charged to have the reference voltage (e.g., ½ VDD or 0.5V), while the set of memory cells 125 can retain programmed or stored data.

In the reading phase during a fourth time period after the third time period for the retention phase, the driver circuit 250 may generate the reference voltage (e.g., ½ VDD or 0.5V) or the ground voltage (e.g., 0V). In the reading phase, the bit line controller 112 may apply the reference voltage (e.g., ½ VDD or 0.5V) to the select line SL. In the reading phase, the word line controller 114 may generate the enable voltage 325 (e.g., VDD or higher), and may apply the enable voltage 325 to the word line WL coupled to the gate electrode of the enable transistor 222 in the selected memory cell 125. In response to the enable voltage 325, the enable transistor 222 in the selected memory cell 125 can be enabled to electrically couple the storage component 228 of the selected memory cell 125 to the bit line BL. In the reading phase, the word line controller 114 may generate a disable voltage 328 (e.g., 0V or lower), and may apply the disable voltage 328 to a word line WL coupled to a gate electrode of an enable transistor 222 in an unselected memory cell 125 of the set of memory cells 125. In response to the disable voltage 328, the enable transistor 222 in the unselected memory cell 125 can be disabled to electrically decouple a storage component 228 of the unselected memory cell 125 from the bit line BL to prevent the unselected memory cell 125 from discharging. In the reading phase, the memory controller 105 or the timing controller 110 may generate a disable voltage 338 (e.g., 0V or lower), and may apply the disable voltage 338 to the gate electrode of the bit line select transistor T1 coupled to the selected memory cell 125. In response to the disable voltage 338, the bit line select transistor T1 can be disabled to electrically decouple the driver circuit 250 from the bit line BL. Hence, the voltage output from the driver circuit 250 may not be applied to the storage component 228 of the selected memory cell 125, and the storage component 228 of the selected memory cell 125 can discharge according to the data stored. In one aspect, a voltage of the bit line BL can be changed or adjusted, according to the data stored by the selected memory cell 125. For example, if the selected memory cell 125 stored a first logic state, then a voltage of the bit line BL may become higher than the reference voltage (e.g., ½ VDD or 0.5V). For example, if the selected memory cell 125 stored a second logic state, then a voltage of the bit line BL may become lower than the reference voltage (e.g., ½ VDD or 0.5V). The bit line sense transistor T2 can detect a change in a voltage of the bit line BL, and conduct current by an amount corresponding to the voltage of the bit line BL. The sensor 280 can detect a current through the bit line sense transistor T2, and determine the data stored by the selected memory cell 125. After reading data stored by a set of memory cells in the reading phase, the set of memory cells 125 can be reset in the initialization phase and can be reprogrammed.

Figure 4:
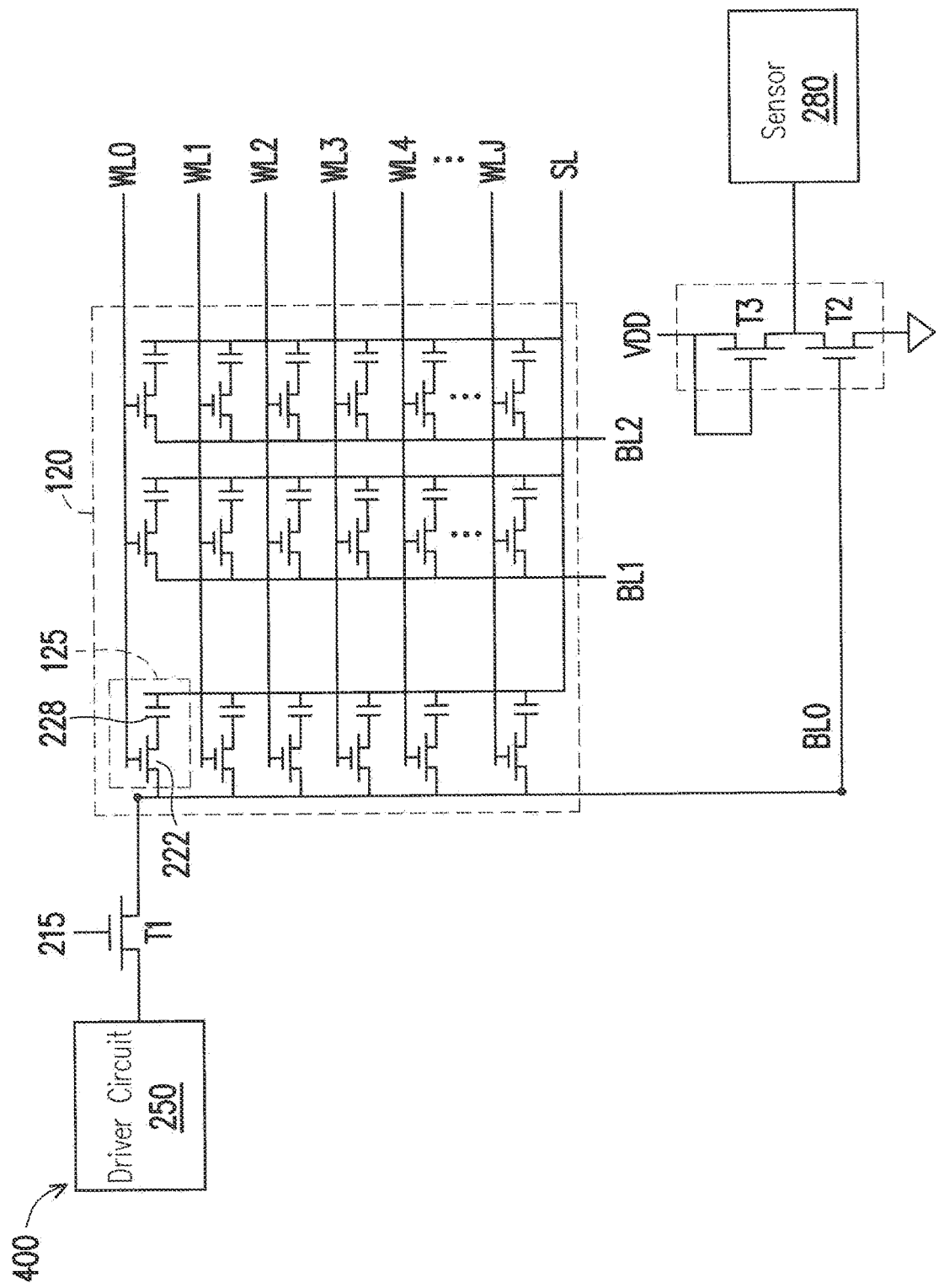
FIG. 4 illustrates a schematic block diagram of an example memory array and circuits for programming and reading data stored by the memory array, in accordance with some embodiments.

FIG. 4 illustrates a schematic block diagram of a portion 400 of an example memory array 120 and circuits (e.g., a driver circuit 250, a sensor 280, a bit line select transistor T1, a bit line sense transistor T2, and a load transistor T3) for programming and reading data stored by the memory array 120, in accordance with some embodiments. The schematic block shown in FIG. 4 is similar to the schematic block diagram in FIG. 2, except the load transistor T3 is coupled to a drain electrode of the bit line sense transistor T2 and a source electrode of the bit line sense transistor T2 is coupled to a metal rail providing the ground voltage (e.g., 0V). Thus, detailed description of duplicated portion thereof is omitted herein for the sake of brevity.

In one configuration, the load transistor T3 is a circuit or a component that can act as a resistive load. In some embodiments, the load transistor T3 can be replaced by a different component (e.g., resistor or a different transistor) that can perform the functionalities of the load transistor T3 described herein. The load transistor T3 can be BJT, MOSFET, FinFET, GaaFET, or any transistor. The load transistor T3 may be an N-type transistor. The bit line select transistor T1, the bit line sense transistor T2, the load transistor T3, and the enable transistors 222 can be of the same type, such that the memory array 120, the bit line select transistor T1, the bit line sense transistor T2, and the load transistor T3 can be implemented through the same fabrication process in a single layer. In one configuration, the load transistor T3 includes a source electrode coupled a drain electrode of the bit line sense transistor T2, a gate electrode coupled to a drain electrode of the load transistor T3, and the drain electrode coupled to a metal rail providing a supply voltage (e.g., VDD). In this configuration, the transistor T3 can operate as a diode to provide a resistive load and generate a voltage at the drain electrode of the load transistor T2, according to the current through the bit line sense transistor T2. In this embodiment, the sensor 280 can be implemented as a voltage sensor. By generating the voltage corresponding to the current through the bit line sense transistor T2, the sensor 280 can be implemented with a simple logic circuit, rather than a complex current sensor.

Figure 5:
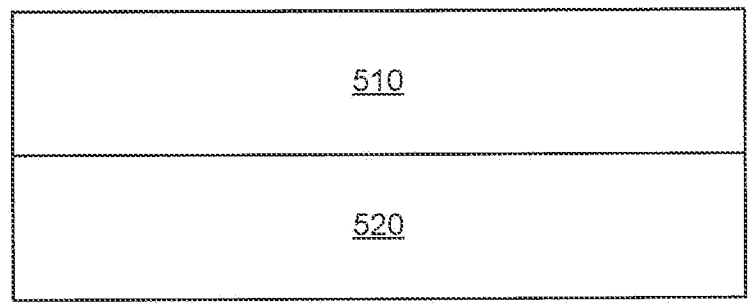
FIG. 5 illustrates example layers of a memory device, in accordance with some embodiments.
Figure 5:
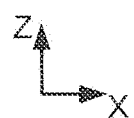

FIG. 5 illustrates example layers 500 of a memory device 100, in accordance with some embodiments. In some embodiments, the memory device 100 is formed in two layers 510, 520. In one implementation, the layer 510 includes the memory array 120, and the layer 520 includes circuits (e.g., memory controller 105) for operating the memory array 120. In one aspect, the bit line select transistor T1, the bit line sense transistor T2, the load transistor T3, or any combination of them can be implemented in the layer 510 with the memory array 120. By implementing the bit line select transistor T1, the bit line sense transistor T2, and/or the load transistor T3 as described above with respect to FIG. 2 or FIG. 4 in the same layer of the memory array 120, circuits (e.g., memory controller 105) for operating the memory array 120 in the layer 520 can be simplified and formed under the layer 510 to achieve area efficiency.

Figure 6:
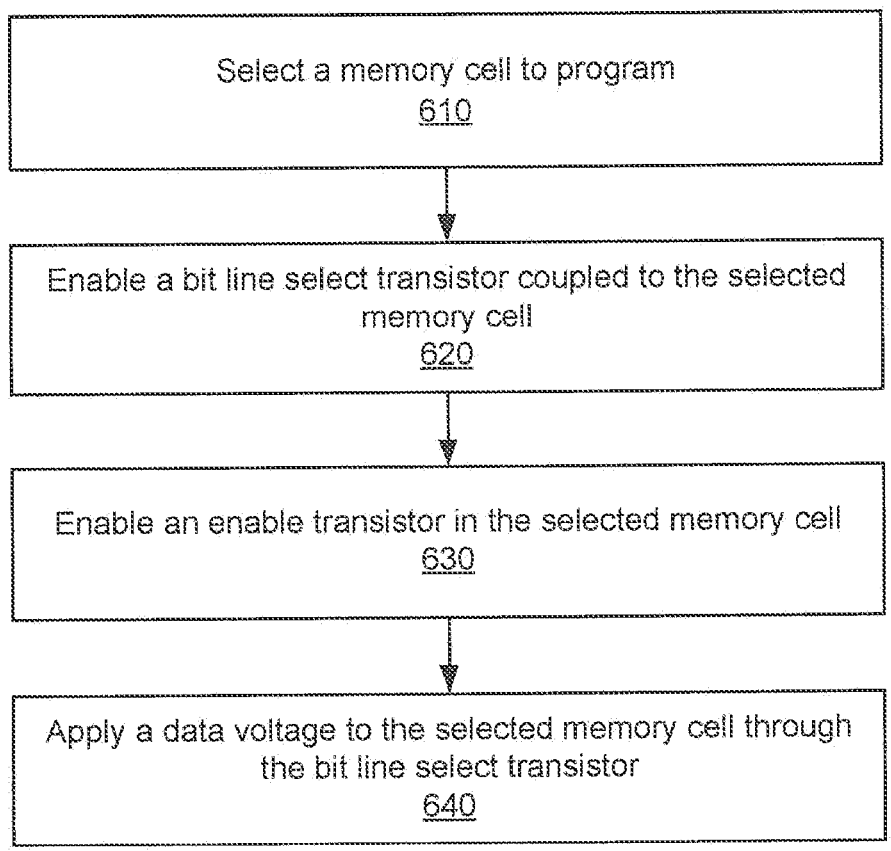
FIG. 6 is a flowchart showing a method of programming a memory device, in accordance with some embodiments.

FIG. 6 is a flowchart showing a method 600 of programming a memory device (e.g., memory device 100), in accordance with some embodiments. In some embodiments, the method 600 is performed by a controller (e.g., memory controller 105). In some embodiments, the method 600 is performed by other entities. In some embodiments, the method 600 is performed in the programming phase. In some embodiments, the method 600 includes more, fewer, or different steps than shown in FIG. 6. In some embodiments, the method 600 can be performed in a different order than shown in FIG. 6.

In one approach, the controller selects 610, from a set of memory cells 125, a memory cell 125 to program. The set of memory cells 125 may be DRAM memory cells. Each memory cell 125 of the set of memory cells 125 may include a corresponding enable transistor 222 and a corresponding storage component 228 (e.g., capacitor) coupled in series between a bit line BL and a select line SL. A gate electrode of the selected memory cell 125 may be coupled to a word line WL, which may be coupled to a gate electrode of a memory cell 125 in another set of memory cells 125. Each memory cell 125 of the another set of memory cells 125 may include a corresponding enable transistor 222 and a corresponding storage component 228 (e.g., capacitor) coupled in series between another bit line BL and the select line SL.

In one approach, the controller enables 620 a bit line select transistor T1 coupled to the selected memory cell 125. In one example, a first bit line select transistor T1 can be coupled to a first bit line BL coupled to a first set of memory cells 125 including the selected memory cell 125, and a second bit line select transistor T1 can be coupled to a second bit line BL coupled to a second set of memory cells 125 not including the selected memory cell 125. The controller can apply an enable voltage (e.g., enable voltage 335) to a gate electrode of the first bit line select transistor T1, such that the first bit line select transistor T1 can be enabled. The controller can apply a disable voltage (e.g., disable voltage 338) to a gate electrode of the second bit line select transistor T1, such that the second bit line select transistor T1 can be disabled.

In one approach, the controller enables 630 an enable transistor 222 in the selected memory cell 125. The controller can apply an enable voltage (e.g., enable voltage 325) to a gate electrode of the enable transistor 222 in the selected memory cell 125, such that the enable transistor 222 in the selected memory cell 125 can be enabled. The controller can apply a disable voltage (e.g., disable voltage 328) to a gate electrode of an enable transistor 222 in an unselected memory cell 125 of the set of memory cells 125, such that the enable transistor 222 in the unselected memory cell 125 can be disabled.

In one approach, the controller applies 640 a data voltage to the selected memory cell 125 through the bit line select transistor T1. For example, the controller can generate a first voltage (e.g., VDD or 1V) as the data voltage to program the selected memory cell 125 to store a first logic state. For example, the controller can generate a second voltage (e.g., 0V) as the data voltage to program the selected memory cell 125 to store a second logic state. By enabling the bit line select transistor T1 in the step 620, the controller can apply the data voltage to the bit line BL coupled to the selected memory cell 125. Moreover, by enabling the enable transistor 222 in the selected memory cell 125 in the step 630, the data voltage can be applied to the storage component 228 in the selected memory cell 125, such that the storage component 228 can be charged or programmed.

Figure 7:
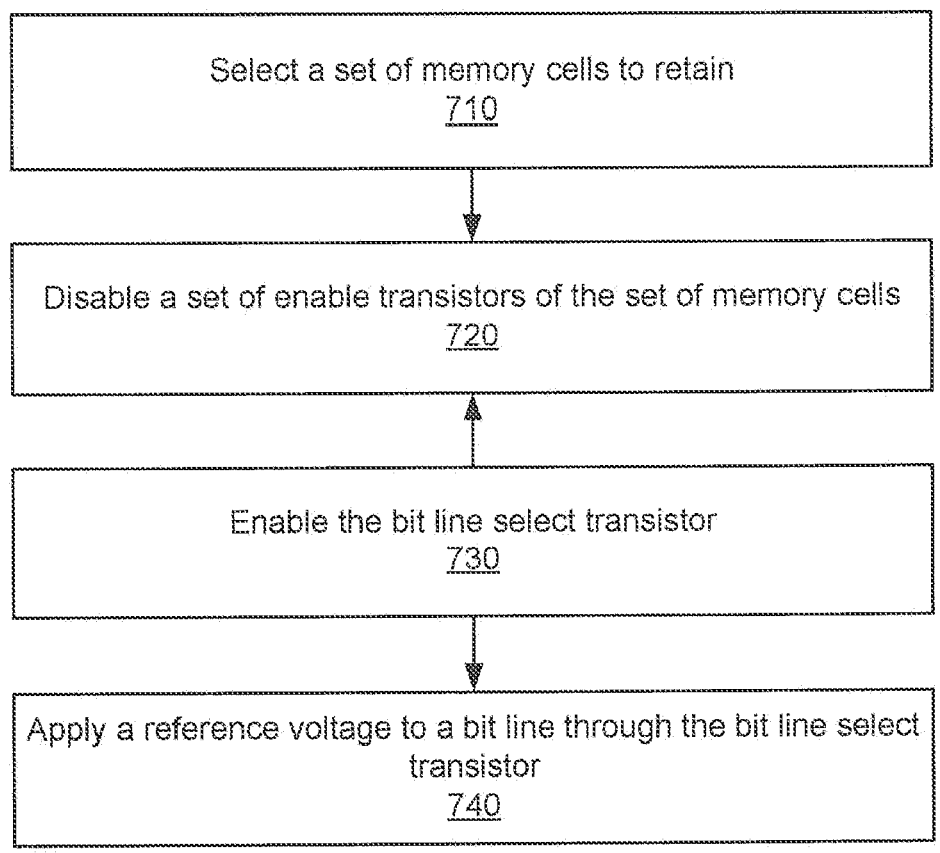
FIG. 7 is a flowchart showing a method of retaining data stored by a memory device, in accordance with some embodiments.

FIG. 7 is a flowchart showing a method 700 of retaining data stored by a memory device (e.g., memory device 100), in accordance with some embodiments. In some embodiments, the method 700 is performed by a controller (e.g., memory controller 105). In some embodiments, the method 700 is performed by other entities. In some embodiments, the method 700 is performed in the retention phase. In some embodiments, the method 700 includes more, fewer, or different steps than shown in FIG. 7. In some embodiments, the method 700 can be performed in a different order than shown in FIG. 7.

In one approach, the controller selects 710 a set of memory cells 125 to retain data. In one aspect, retaining data is performed for a set of memory cells 125, such that programming or reading data for an individual memory cell 125 in the set of memory cells 125 may not be performed.

In one approach, the controller disables 720 enable transistors 222 in the set of memory cells 125. The controller can apply a disable voltage (e.g., disable voltage 328) to gate electrodes of enable transistors 222 in the set of memory cells 125, such that the enable transistors 222 in the set of memory cells 125 can be disabled.

In one approach, the controller enables 730 a bit line select transistor T1 coupled to the set of memory cells 125. The controller can apply an enable voltage (e.g., enable voltage 335) to a gate electrode of the bit line select transistor T1, such that the bit line select transistor T1 can be enabled.

In one approach, the controller applies 740 a reference voltage (e.g., ½ VDD or 0.5V) to the bit line BL through the bit line select transistor T1. The reference voltage can be between the first voltage (e.g., VDD or 1V) corresponding to a first logic state and the second voltage (e.g., GND or 0V) corresponding to a second logic state. Because the bit line select transistor T1 is enabled in the step 730, the reference voltage can be applied to the bit line BL through the bit line select transistor T1, and the bit line BL can be pre-charged to have the reference voltage (e.g., ½ VDD or 0.5V). Meanwhile, because the enable transistors 222 in the set of memory cells 125 are disabled in the step 720, storage components 228 of the set of memory cells 125 can be electrically decoupled from the bit line BL. Accordingly, the reference voltage may not be applied to the storage components 228 of the set of memory cells 125, thereby allowing the set of memory cells 125 to maintain data.

Figure 8:
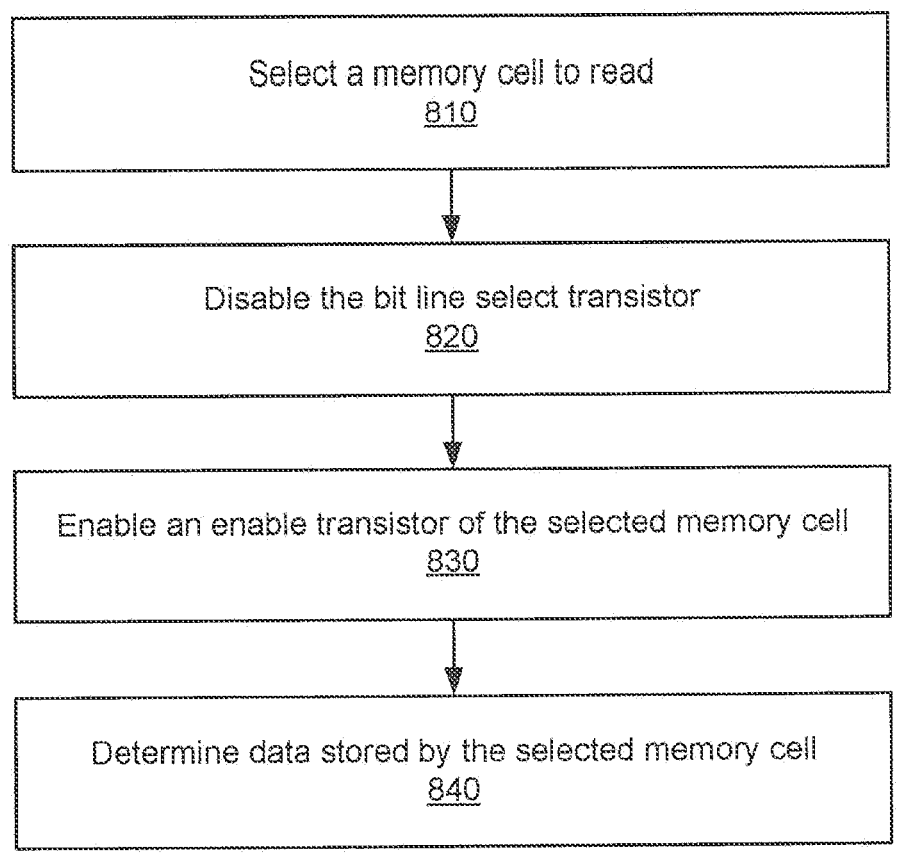
FIG. 8 is a flowchart showing a method of reading data stored by a memory device, in accordance with some embodiments.

FIG. 8 is a flowchart showing a method 800 of reading data stored by a memory device (e.g., memory device 100), in accordance with some embodiments. In some embodiments, the method 800 is performed by a controller (e.g., memory controller 105). In some embodiments, the method 800 is performed by other entities. In some embodiments, the method 800 is performed in the reading phase. In some embodiments, the method 800 includes more, fewer, or different steps than shown in FIG. 8. In some embodiments, the method 800 can be performed in a different order than shown in FIG. 8.

In one approach, the controller selects 810, from a set of memory cells 125, a memory cell 125 to read data.

In one approach, the controller disables 820 a bit line select transistor T1 coupled to the selected memory cell 125. In one example, the controller can apply a disable voltage (e.g., disable voltage 338) to a gate electrode of the bit line select transistor T1, such that the first bit line select transistor T1 can be disabled. The controller can apply an enable voltage (e.g., enable voltage 335) to a gate electrode of another bit line select transistor T1, such that the another bit line select transistor T1 can be enabled.

In one approach, the controller enables 830 an enable transistor 222 in the selected memory cell 125. The controller can apply an enable voltage (e.g., enable voltage 325) to a gate electrode of the enable transistor 222 in the selected memory cell 125, such that the enable transistor 222 in the selected memory cell 125 can be enabled. The controller can apply a disable voltage (e.g., disable voltage 328) to a gate electrode of an enable transistor 222 in an unselected memory cell 125 of the set of memory cells 125, such that the enable transistor 222 in the unselected memory cell 125 can be disabled.

In one approach, the controller determines 840 a data stored by the selected memory cell. In one aspect, by disabling the bit line select transistor T1 in the step 820 and enabling the enable transistor 222 of the selected memory cell 125 in the step 830, a voltage of the bit line BL can be changed or adjusted, according to the data stored by the selected memory cell 125. For example, if the selected memory cell 125 stored a first logic state, then a voltage of the bit line BL may become higher than the reference voltage (e.g., ½ VDD or 0.5V). For example, if the selected memory cell 125 stored a second logic state, then a voltage of the bit line BL may become lower than the reference voltage (e.g., ½ VDD or 0.5V). In one configuration, the bit line BL is coupled to a gate electrode of the bit line sense transistor T2. Hence, the bit line sense transistor T2 can detect a change in a voltage of the bit line BL, and conduct current by an amount corresponding to the voltage of the bit line BL. The sensor 280 can detect a current through the bit line sense transistor T2, and determine the data stored by the selected memory cell 125 according to the current through the bit line sense transistor T2.

Advantageously, the disclosed memory device 100 can be implemented in an area efficient manner. In some cases, a memory device including DRAM memory cells (e.g., memory cells 125) may include complex circuits for programming and reading data. The disclosed memory device 100 implements, for a bit line BL, a bit line select transistor T1 and a bit line sense transistor T2 having a simple configuration. By implementing the bit line select transistor T1 and the bit line sense transistor T2, complex circuits for programming or reading data can be obviated. In one aspect, the bit line select transistor T1, the bit line sense transistor T2, and enable transistors 222 of the memory cells 125 can be of a same type. Hence, the bit line select transistor T1, the bit line sense transistor T2, and the enable transistors 222 of the memory cells 125 can be implemented in a same layer (e.g., 510) through the same fabrication process. By implementing, the bit line select transistor T1 and the bit line sense transistor T2 in the same layer of the memory cells 125, the memory device 100 can have a simple configuration and can be implemented in an area efficient manner.

Figure 9:
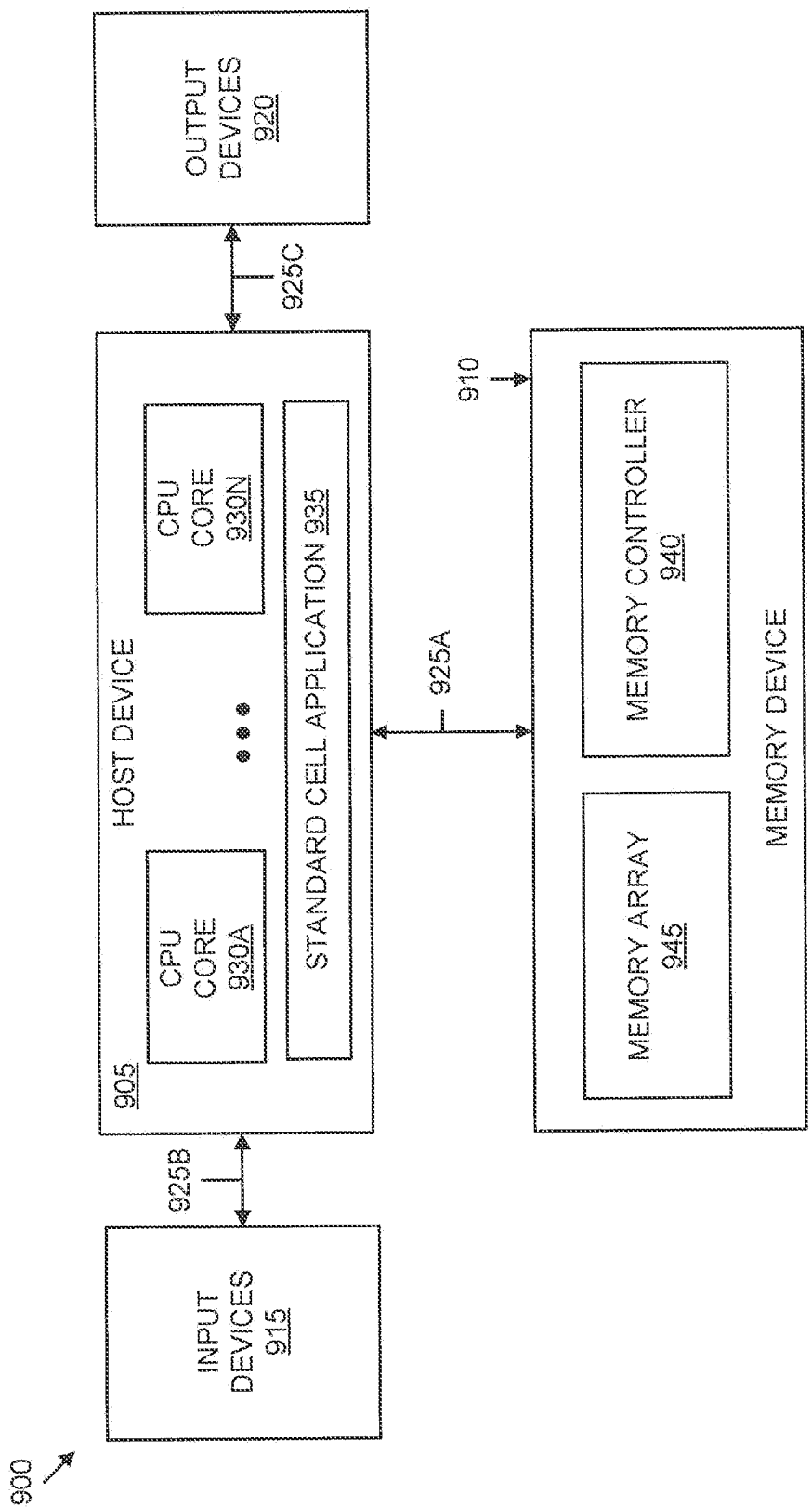
FIG. 9 is an example block diagram of a computing system, in accordance with some embodiments.

Referring now to FIG. 9, an example block diagram of a computing system 900 is shown, in accordance with some embodiments of the disclosure. The computing system 900 may be used by a circuit or layout designer for integrated circuit design. A "circuit" as used herein is an interconnection of electrical components such as resistors, transistors, switches, batteries, inductors, or other types of semiconductor devices configured for implementing a desired functionality. The computing system 900 includes a host device 905 associated with a memory device 910. The host device 905 may be configured to receive input from one or more input devices 915 and provide output to one or more output devices 920. The host device 905 may be configured to communicate with the memory device 910, the input devices 915, and the output devices 920 via appropriate interfaces 925A, 925B, and 925C, respectively. The computing system 900 may be implemented in a variety of computing devices such as computers (e.g., desktop, laptop, servers, data centers, etc.), tablets, personal digital assistants, mobile devices, other handheld or portable devices, or any other computing unit suitable for performing schematic design and/or layout design using the host device 905.

The input devices 915 may include any of a variety of input technologies such as a keyboard, stylus, touch screen, mouse, track ball, keypad, microphone, voice recognition, motion recognition, remote controllers, input ports, one or more buttons, dials, joysticks, and any other input peripheral that is associated with the host device 905 and that allows an external source, such as a user (e.g., a circuit or layout designer), to enter information (e.g., data) into the host device and send instructions to the host device. Similarly, the output devices 920 may include a variety of output technologies such as external memories, printers, speakers, displays, microphones, light emitting diodes, headphones, video devices, and any other output peripherals that are configured to receive information (e.g., data) from the host device 905. The "data" that is either input into the host device 905 and/or output from the host device may include any of a variety of textual data, circuit data, signal data, semiconductor device data, graphical data, combinations thereof, or other types of analog and/or digital data that is suitable for processing using the computing system 900.

The host device 905 includes or is associated with one or more processing units/processors, such as Central Processing Unit ("CPU") cores 930A . . . 730N. The CPU cores 930A . . . 930N may be implemented as an Application Specific Integrated Circuit ("ASIC"), Field Programmable Gate Array ("FPGA"), or any other type of processing unit. Each of the CPU cores 930A . . . 930N may be configured to execute instructions for running one or more applications of the host device 905. In some embodiments, the instructions and data to run the one or more applications may be stored within the memory device 910. The host device 905 may also be configured to store the results of running the one or more applications within the memory device 910. Thus, the host device 905 may be configured to request the memory device 910 to perform a variety of operations. For example, the host device 905 may request the memory device 910 to read data, write data, update or delete data, and/or perform management or other operations. One such application that the host device 905 may be configured to run may be a standard cell application 935. The standard cell application 935 may be part of a computer aided design or electronic design automation software suite that may be used by a user of the host device 905 to use, create, or modify a standard cell of a circuit. In some embodiments, the instructions to execute or run the standard cell application 935 may be stored within the memory device 910. The standard cell application 935 may be executed by one or more of the CPU cores 930A . . . 930N using the instructions associated with the standard cell application from the memory device 910. In one example, the standard cell application 935 allows a user to utilize pre-generated schematic and/or layout designs of the memory device 100 or a portion of the memory device 100 to aid integrated circuit design. After the layout design of the integrated circuit is complete, multiples of the integrated circuit, for example, including the memory device 100, or any portion of the memory device 100 can be fabricated according to the layout design by a fabrication facility.

Referring still to FIG. 9, the memory device 910 includes a memory controller 940 that is configured to read data from or write data to a memory array 945. The memory array 945 may include a variety of volatile and/or non-volatile memories. For example, in some embodiments, the memory array 945 may include NAND flash memory cores. In other embodiments, the memory array 945 may include NOR flash memory cores, Static Random Access Memory (SRAM) cores, Dynamic Random Access Memory (DRAM) cores, Magnetoresistive Random Access Memory (MRAM) cores, Phase Change Memory (PCM) cores, Resistive Random Access Memory (ReRAM) cores, 3D XPoint memory cores, ferroelectric random-access memory (FeRAM) cores, and other types of memory cores that are suitable for use within the memory array. The memories within the memory array 945 may be individually and independently controlled by the memory controller 940. In other words, the memory controller 940 may be configured to communicate with each memory within the memory array 945 individually and independently. By communicating with the memory array 945, the memory controller 940 may be configured to read data from or write data to the memory array in response to instructions received from the host device 905. Although shown as being part of the memory device 910, in some embodiments, the memory controller 940 may be part of the host device 905 or part of another component of the computing system 900 and associated with the memory device 910. The memory controller 940 may be implemented as a logic circuit in either software, hardware, firmware, or combination thereof to perform the functions described herein. For example, in some embodiments, the memory controller 940 may be configured to retrieve the instructions associated with the standard cell application 935 stored in the memory array 945 of the memory device 910 upon receiving a request from the host device 905.

It is to be understood that only some components of the computing system 900 are shown and described in FIG. 9. However, the computing system 900 may include other components such as various batteries and power sources, networking interfaces, routers, switches, external memory systems, controllers, etc. Generally speaking, the computing system 900 may include any of a variety of hardware, software, and/or firmware components that are needed or considered desirable in performing the functions described herein. Similarly, the host device 905, the input devices 915, the output devices 920, and the memory device 910 including the memory controller 940 and the memory array 945 may include other hardware, software, and/or firmware components that are considered necessary or desirable in performing the functions described herein.

In one aspect of the present disclosure, a memory device is disclosed. In some embodiments, the memory device includes a memory array. In some embodiments, the memory array includes a set of memory cells. In some embodiments, each of the set of memory cells includes a corresponding transistor and a corresponding capacitor connected in series between a bit line and a select line. In some embodiments, the memory device includes a first transistor and a second transistor. In some embodiments, the first transistor includes a source/drain electrode coupled to a controller, and another source/drain electrode coupled to the bit line. In some embodiments, the second transistor includes a gate electrode coupled to the bit line. In some embodiments, the second transistor is configured to conduct current corresponding to data stored by a memory cell of the set of memory cells.

In another aspect of the present disclosure, a memory device is disclosed. In some embodiments, the memory device includes a controller. In some embodiments, the memory device includes a first set of memory cells including a first memory cell and a second memory cell coupled in parallel between a first bit line and a select line. In some embodiments, the memory device includes a second set of memory cells including a third memory cell and a fourth memory cell coupled in parallel between a second bit line and the select line. In some embodiments, the memory device includes a first word line coupled to the first memory cell and the third memory cell. In some embodiments, the memory device includes a second word line coupled to the second memory cell and the fourth memory cell. In some embodiments, the memory device includes a first transistor coupled between the controller and the first bit line. In some embodiments, the memory device includes a second transistor including a gate electrode coupled to the first bit line. In some embodiments, the memory device includes a third transistor coupled between the controller and the second bit line. In some embodiments, the memory device includes a fourth transistor including a gate electrode coupled to the second bit line.

In yet another aspect of the present disclosure, a method of operating a memory device is disclosed. In some embodiments, the method includes enabling, by a controller, a first transistor during a first time period to program data to a memory cell of a set of memory cells. In some embodiments, the first transistor includes a source/drain electrode coupled to the controller and another source/drain electrode coupled to a bit line. In some embodiments, the bit line is coupled to the set of memory cells. In some embodiments, each of the set of memory cells includes a corresponding transistor and a corresponding capacitor connected in series between the bit line and a select line. In some embodiments, the bit line is coupled to a gate electrode of a second transistor. In some embodiments, the method includes enabling, by the controller, the corresponding transistor of the memory cell during the first time period. In some embodiments, the method includes applying, by the controller, a voltage corresponding to the data to the source/drain electrode of the first transistor during the first time period.

In some embodiments, the method includes disabling, by the controller, the first transistor during a second time period to read the data stored by the memory cell of the set of memory cells. In some embodiments, the method includes enabling, by the controller, the corresponding transistor of the memory cell during the second time period. In some embodiments, the method includes determining, by the controller, the data stored by the memory cell, according to a current through the second transistor.

In some embodiments, the voltage corresponding to a first logic state of the data is a first voltage, and the voltage corresponding to a second logic state of the data is a second voltage lower than the first voltage. In some embodiments, the method includes enabling, by the controller, the first transistor during a third time period to maintain the data stored by the memory cell. In some embodiments, the method includes applying, by the controller, a third voltage to the source/drain electrode of the first transistor during the third time period. The third voltage may be between the first voltage and the second voltage. In some embodiments, the method includes disabling, by the controller, the corresponding transistor of the memory cell during the third time period. The third time period may be between the first time period and the second time period.

The term "coupled" and variations thereof includes the joining of two members directly or indirectly to one another. The term "electrically coupled" and variations thereof includes the joining of two members directly or indirectly to one another through conductive materials (e.g., metal or copper traces). Such joining may be stationary (e.g., permanent or fixed) or moveable (e.g., removable or releasable). Such joining may be achieved with the two members coupled directly with or to each other, with the two members coupled with each other using a separate intervening member and any additional intermediate members coupled with one another, or with the two members coupled with each other using an intervening member that is integrally formed as a single unitary body with one of the two members. If "coupled" or variations thereof are modified by an additional term (e.g., directly coupled), the generic definition of "coupled" provided above is modified by the plain language meaning of the additional term (e.g., "directly coupled" means the joining of two members without any separate intervening member), resulting in a narrower definition than the generic definition of "coupled" provided above. Such coupling may be mechanical, electrical, or fluidic.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory device comprising:
    a memory array including a set of memory cells, each of the set of memory cells including a corresponding transistor and a corresponding capacitor connected in series between a bit line and a select line;
    a first transistor including:
        a source/drain electrode coupled to a controller, and
        another source/drain electrode coupled to the bit line; and
    a second transistor including a gate electrode coupled to the bit line, the second transistor to conduct current corresponding to data stored by a memory cell of the set of memory cells;
    wherein the controller is to:
        enable, during a programming phase, the first transistor and the corresponding transistor of the memory cell, and
        apply, during the programming phase, a voltage corresponding to the data to the source/drain electrode of the first transistor.

2. The memory device of claim 1, wherein the controller is to:
    disable, during a reading phase, the first transistor,
    enable, during the reading phase, the corresponding transistor of the memory cell, and
    determine, during the reading phase, the data stored by the memory cell, according to the current through the second transistor.

3. The memory device of claim 1, wherein the controller is to:
    enable, during a retention phase, the first transistor,
    disable, during the retention phase, the corresponding transistor of the memory cell, and
    apply, during the retention phase, another voltage corresponding to the data to the source/drain electrode of the first transistor.

4. The memory device of claim 3,
    wherein the voltage corresponding to a first logic state of the data is a first voltage, and
    wherein the voltage corresponding to a second logic state of the data is a second voltage lower than the first voltage.

5. The memory device of claim 4, wherein the another voltage is between the first voltage and the second voltage.

6. The memory device of claim 1,
    wherein the set of memory cells, the first transistor, and the second transistor are formed in a first layer, and
    wherein the controller is formed in a second layer.

7. The memory device of claim 1, wherein the memory array further includes another set of memory cells, each of the another set of memory cells including a corresponding transistor and a corresponding capacitor connected to each other in series between another bit line and the select line, the memory device further including:
    a third transistor including:
        a source/drain electrode coupled to the controller, and
        another source/drain electrode coupled to the another bit line; and
    a fourth transistor including a gate electrode coupled to the another bit line, the fourth transistor to conduct current corresponding to another data stored by another memory cell of the another set of memory cells.

8. The memory device of claim 7, wherein a gate electrode of the corresponding transistor of the memory cell and a gate electrode of the corresponding transistor of the another memory cell are coupled to a word line.

9. The memory device of claim 1, wherein each memory cell of the set of memory cells is a dynamic random access memory cell.

10. A memory device comprising:
    a controller;
    a first set of memory cells including a first memory cell and a second memory cell coupled in parallel between a first bit line and a select line;
    a second set of memory cells including a third memory cell and a fourth memory cell coupled in parallel between a second bit line and the select line;
    a first word line coupled to the first memory cell and the third memory cell;
    a second word line coupled to the second memory cell and the fourth memory cell;
    a first transistor coupled between the controller and the first bit line;
    a second transistor including a gate electrode coupled to the first bit line;
    a third transistor coupled between the controller and the second bit line; and
    a fourth transistor including a gate electrode coupled to the second bit line.

11. The memory device of claim 10, wherein, for programming data by the first memory cell, the controller is to enable the first transistor to apply a voltage corresponding to the data to the first bit line through the first transistor, while a first voltage is applied to the first word line and a second voltage is applied to the second word line.

12. The memory device of claim 11, wherein, for reading the data stored by the first memory cell, the controller is to disable the first transistor, while the first voltage is applied to the first word line and the second voltage is applied to the second word line.

13. The memory device of claim 11, wherein, for retaining the data stored by the first memory cell, the controller is to enable the first transistor to apply another voltage to the first bit line, while the second voltage is applied to the first word line and the second word line.

14. The memory device of claim 13,
wherein the voltage corresponding to a first logic state of the data is a third voltage, and
wherein the voltage corresponding to a second logic state of the data is a fourth voltage lower than the third voltage.

15. The memory device of claim 14, wherein the another voltage is between the third voltage and the fourth voltage.

16. The memory device of claim 10,
wherein the first set of memory cells, the second set of memory cells, the first transistor, the second transistor, the third transistor, and the fourth transistor are formed in a first layer, and
wherein the controller is formed in a second layer.

17. A method comprising:
enabling, by a controller, a first transistor during a first time period to program data to a memory cell of a set of memory cells, wherein the first transistor includes a source/drain electrode coupled to the controller and another source/drain electrode coupled to a bit line, wherein the bit line is coupled to the set of memory cells, wherein each of the set of memory cells includes a corresponding transistor and a corresponding capacitor connected in series between the bit line and a select line, wherein the bit line is coupled to a gate electrode of a second transistor;
enabling, by the controller, the corresponding transistor of the memory cell during the first time period; and
applying, by the controller, a voltage corresponding to the data to the source/drain electrode of the first transistor during the first time period.

18. The method of claim 17, further comprising:
disabling, by the controller, the first transistor during a second time period to read the data stored by the memory cell of the set of memory cells;
enabling, by the controller, the corresponding transistor of the memory cell during the second time period; and
determining, by the controller, the data stored by the memory cell, according to a current through the second transistor.

19. The method of claim 17,
wherein the voltage corresponding to a first logic state of the data is a first voltage, and
wherein the voltage corresponding to a second logic state of the data is a second voltage lower than the first voltage, the method further comprising:
enabling, by the controller, the first transistor during a third time period to maintain the data stored by the memory cell;
applying, by the controller, a third voltage to the source/drain electrode of the first transistor during the third time period, the third voltage between the first voltage and the second voltage; and
disabling, by the controller, the corresponding transistor of the memory cell during the third time period.

* * * * *